(12) United States Patent
Rajagopalan et al.

(10) Patent No.: US 6,518,161 B1
(45) Date of Patent: Feb. 11, 2003

(54) METHOD FOR MANUFACTURING A DUAL CHIP IN PACKAGE WITH A FLIP CHIP DIE MOUNTED ON A WIRE BONDED DIE

(75) Inventors: Sarathy Rajagopalan, Fremont, CA (US); Kishor Desai, Fremont, CA (US)

(73) Assignee: LSI Logic Corporation, Milpitas, CA (US)

(*) Notice: Subject to any disclaimer, the term of this patent is extended or adjusted under 35 U.S.C. 154(b) by 57 days.

(21) Appl. No.: 09/801,007

(22) Filed: Mar. 7, 2001

(51) Int. Cl.[7] .............................................. H01L 21/44
(52) U.S. Cl. ........................ 438/612; 438/613; 438/617; 438/666
(58) Field of Search ............................ 257/678; 438/98, 438/597, 612, 613, 615, 617, 652, 666

(56) References Cited

U.S. PATENT DOCUMENTS 5,445,311 A * 8/1995 Trask et al. ................. 228/175

* cited by examiner

*Primary Examiner*—Roy Potter
(74) *Attorney, Agent, or Firm*—Westman, Champlin & Kelly

(57) ABSTRACT

A method for creating a die that has some bond pads that are compatible with wire bonding and others that are compatible with solder bonding. A layer of copper is disposed over aluminum bond pads and selectively removed from those bond pads that are desired to be compatible with wire bonding.

21 Claims, 5 Drawing Sheets

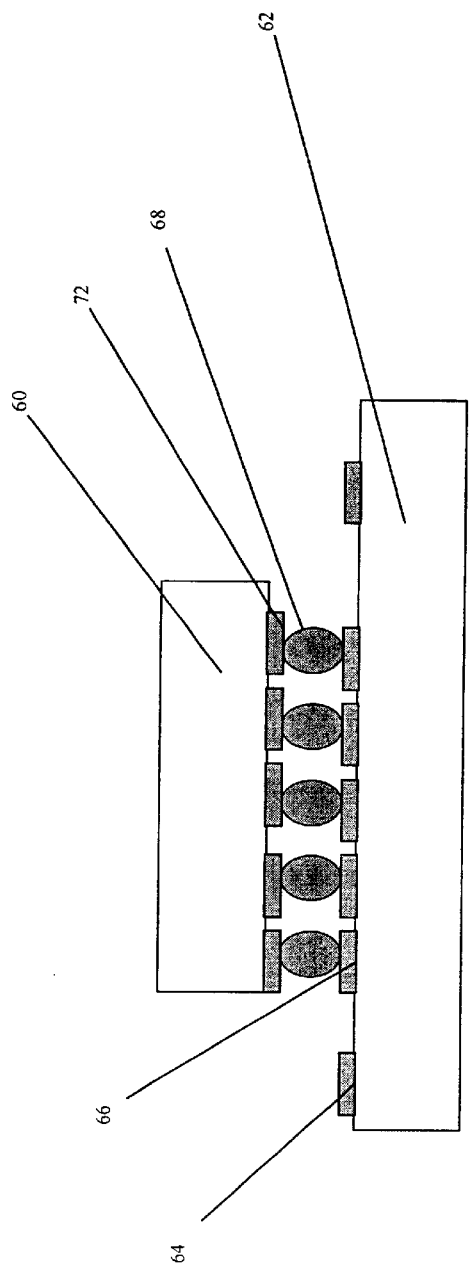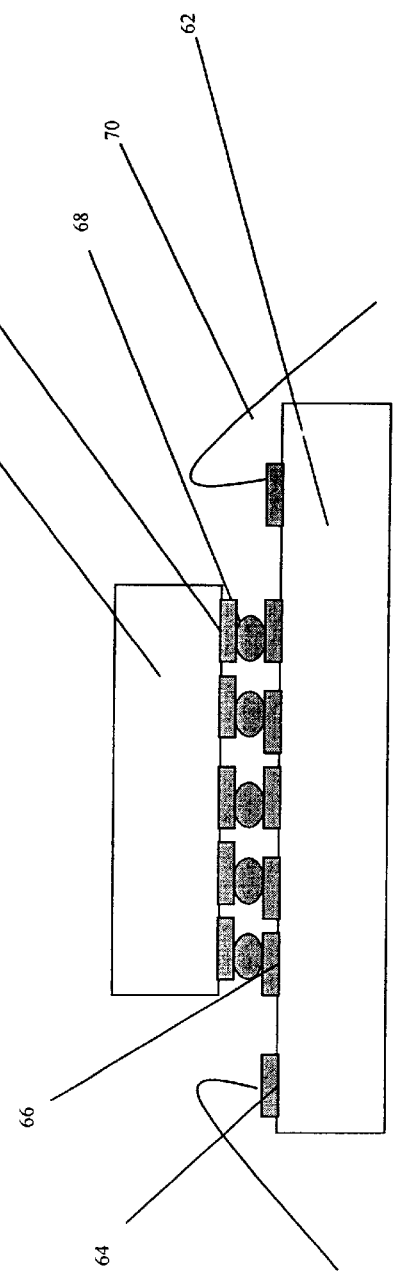
Figure 4a
Figure 4b

METHOD FOR MANUFACTURING A DUAL CHIP IN PACKAGE WITH A FLIP CHIP DIE MOUNTED ON A WIRE BONDED DIE

BACKGROUND OF THE INVENTION

1. Field of the Invention

The invention relates generally to semiconductor packaging. More specifically, the invention relates to the design and manufacturing process of a semiconductor package that allows the incorporation of more than one chip device into a single package.

2. Description of the Related Art

For a variety of reasons well known in the art, semiconductor packages that have more than one chip, otherwise known as multi-chip modules ("MCM's"), are becoming increasingly popular. One type of possible MCM is shown in FIG. 1, which is disclosed in U.S. patent application Ser. No. 09/461,704, entitled "Multi-Chip Package Including Memory and Logic," filed Dec. 14, 1999, and is owned by the assignee of the present invention. The MCM shown in FIG. 1 comprises a top die 10 stacked on top of a bottom die 12, which is in turn mounted on a substrate 18. The top die 10 is mounted on the bottom die 12 in flip chip fashion such that the top die 10 communicates with the bottom die 12 through a plurality of (collapsed) solder balls 20. The bottom die 12, in turn, communicates with the substrate 18 through a plurality of wires 14. Thus, the bottom die 12 has two types of bond pads: flip-chip bond pads that are coupled to a plurality of solder balls 20 and wire bond pads that are coupled to the plurality of wires 14.

Both types of bond pads are aluminum. Aluminum bond pads form effective bonds with the plurality of wires 14. However, the aluminum bond pads may not effectively bond to the plurality of solder balls 20, which often comprise eutectic solder (e.g., 63% Sn/37% Pb). The mismatch between the different types of bonding, solder ball and wire bond, makes it somewhat difficult to manufacture the package shown in FIG. 1. It would be desirable to improve the efficiency of the manufacturing process for a package such as that shown in FIG. 1.

SUMMARY OF THE INVENTION

To achieve the foregoing, the present invention provides a method for manufacturing a die comprising two different types of bond pads, one type that is compatible with wire bonding and another type that is compatible with solder bonding. In one embodiment, the bond pads that are compatible with wire bonding have a top layer of aluminum while the bond pads that are compatible with solder bonding have a top layer of copper.

All of the bond pads can initially consist of aluminum. To selectively form copper over the solder compatible bond pads, a layer of copper is disposed over all the bond pads and selectively etched away from over the wire bonding compatible bond pads. The copper can be selectively etched by disposing a layer of photoresist over the copper, removing the photoresist from over the wire bonding compatible bond pads, and then dissolving the copper in a suitable solution. The solution, dissolved copper and remaining photoresist are then removed, thereby leaving copper over the solder compatible bond pads while returning the wire bonding compatible bond pads to aluminum without an overlay of copper.

BRIEF DESCRIPTION OF THE DRAWINGS

FIGS. 4a and 4b, respectively, show possible steps for flip chip mounting a top die on a bottom die that has been processed in accordance with FIGS. 2a–2f.

Figure 1:
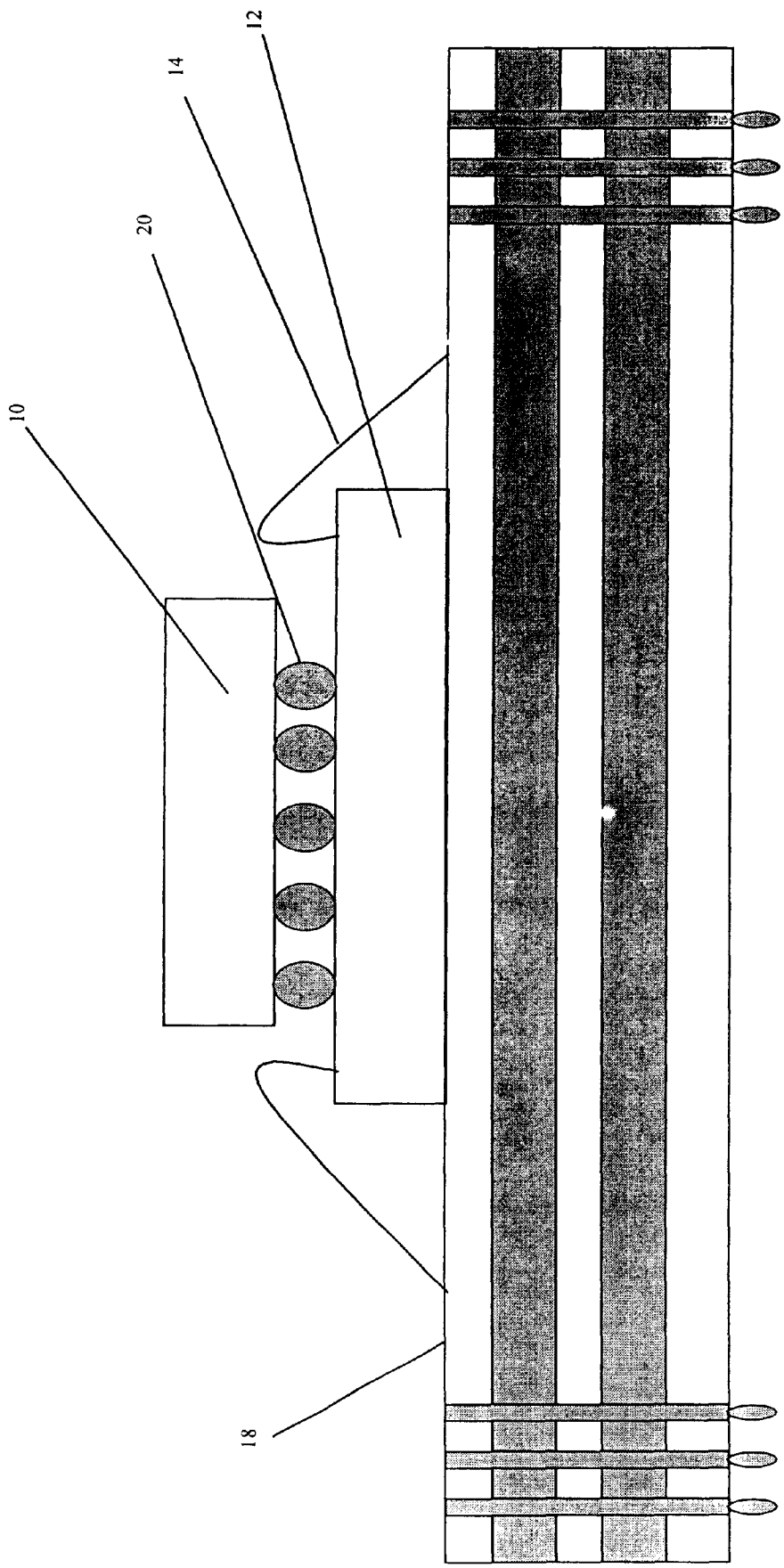
FIG. 1 is a cross sectional view of a flip-chip on wire bond multi-chip module package.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF ILLUSTRATIVE EMBODIMENTS

Definitions

A material or other item is said to be "over" a bond pad when a line that is normal to the surface of the bond pad passes through that material or item. Thus, a material or item may be "over" a bond pad without being on the bond pad.

A "solder compatible material" is a material that bonds with solder when the solder is melted at temperatures above 183° C.

FIGS. 2a–2f are sectional views, not to scale, illustrating successive steps, according to the teachings of the present invention, in the preparation of a die that may be used in a package such as that shown in FIG. 1. However, it will be appreciated that the present invention is not limited to constructing packages identical to those in FIG. 1.

Figure 2A:
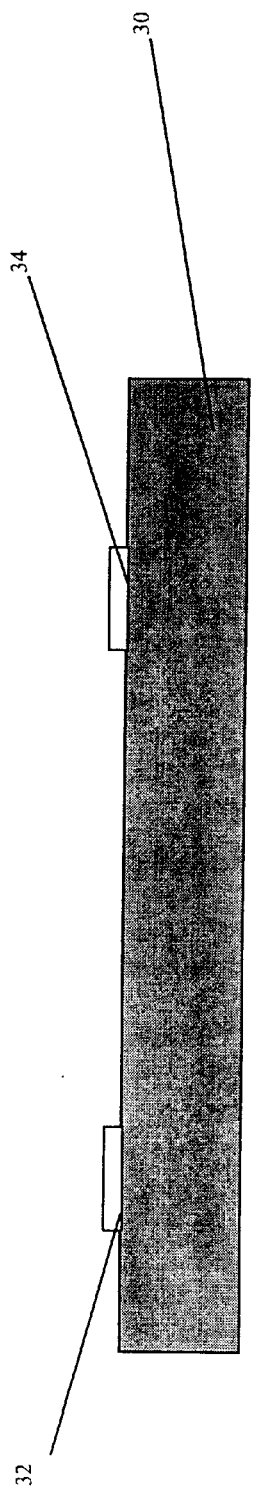
FIGS. 2a–2f are sectional views, not to scale, illustrating successive steps, according to the teachings of the present invention, in the preparation of a die that may be used in a package such as that shown in FIG. 1.
Figure 2B:
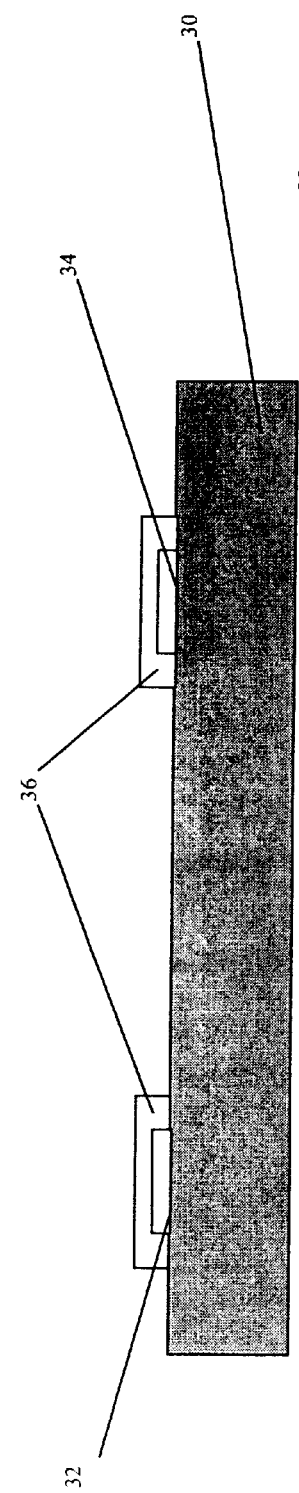
Figure 3:
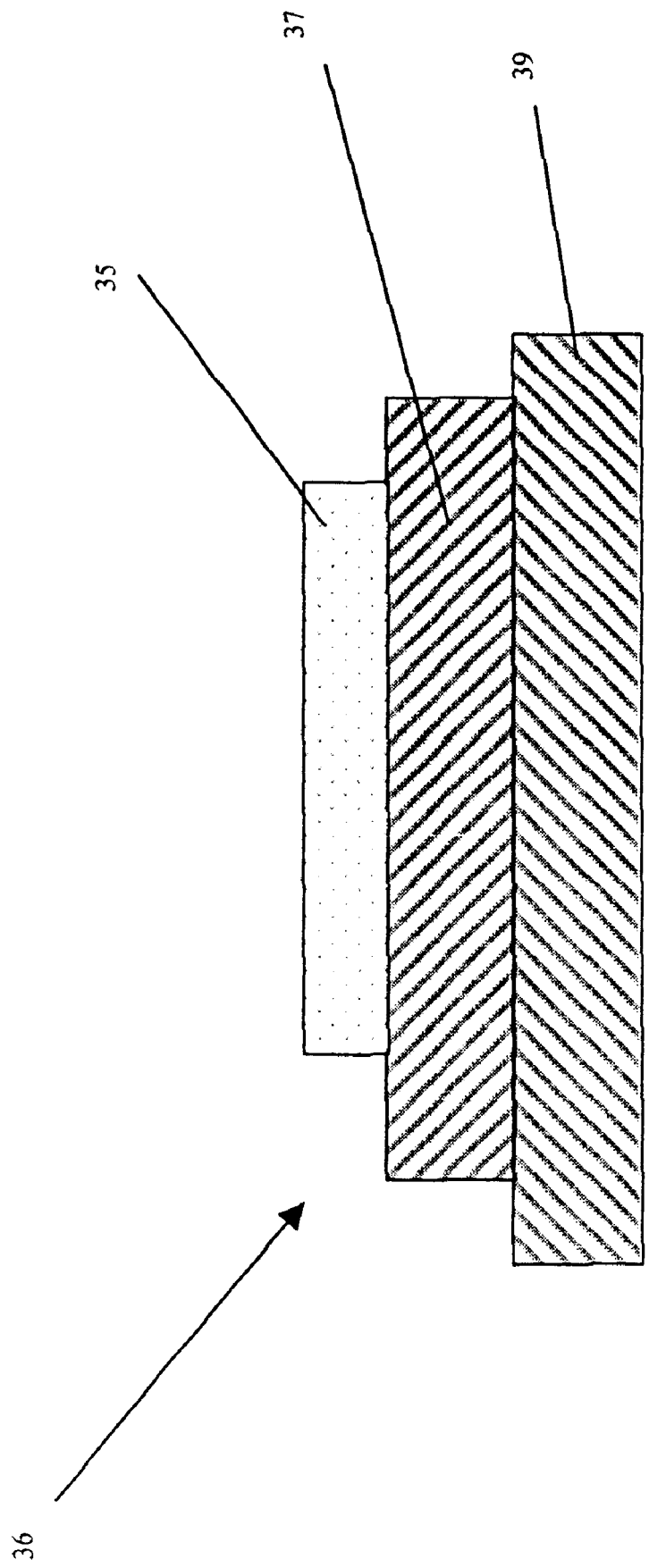
FIG. 3 is an expanded cross section view of under the bump metallurgy shown diagrammatically in FIGS. 2b–2f.

As shown in FIG. 2a, a semiconductor die 30 comprises a first bond pad 32 and a second bond pad 34, each of which consists of aluminum. The first bond pad 32 and the second bond pad 34 may comprise other wire bond compatible materials, including, without limitation, aluminum alloys. For the purposes of clarity, only two bond pads are shown but it will be appreciated that more than two bonds are usually present on semiconductor dies such as the die 30. It is desired to make the first bond pad 32 compatible with wire bonding and the second bond pad 34 compatible with flip-chip type bonding. "Under bump metallurgy" 36, comprising nickel, vanadium and copper, is deposited on the first bond pad 32 and the second bond pad 34, as shown in FIG. 2b. One suitable under bump metallurgy process is performed by Flip Chip Technologies Inc. FIG. 3 is an expanded cross section view of the under bump metallurgy 36. As shown in the Figure, a layer of copper 35 overlies a layer of vanadium 37, which in turn overlies a layer of nickel 39. Thus, referring back to FIG. 2b, copper is now the top layer on the first bond pad 32 and the second bond pad 34. Although copper is the preferred top layer material for the second bond pad 34, it will be appreciated that other solder compatible materials may be employed, including, without limitation: Cu—Ni/Au.

Figure 2C:
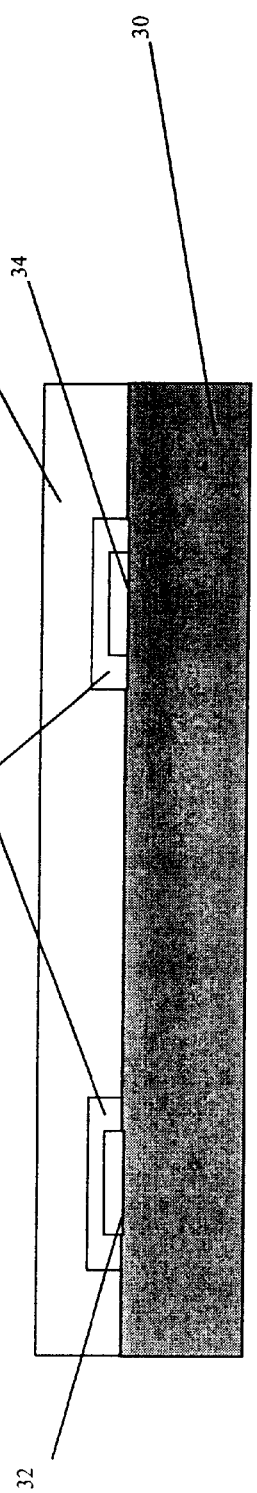
Figure 2D:
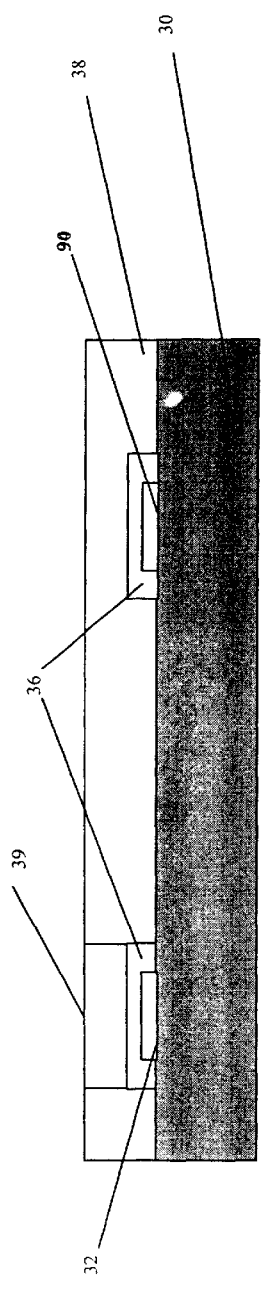

Next, a layer of photoresist 38 is disposed over the first bond pad 32 and the second bond pad 34 and the remainder of the top layer of the die 30, as shown in FIG. 2c. As shown in FIG. 2d, the first bond pad 32 is exposed by creating a hole 39 in the photoresist 38 over the first bond pad 32. The hole 39 may be created in many ways. In one embodiment, the hole 39 is created by employing well known lithography/etch techniques used widely in semiconductor manufacturing. In particular, the top surface of the die 30 is masked with a pattern, the mask/die 30 assembly is exposed to light (lithography), the photoresist 38 is developed and then selectively etched.

Figure 2E:
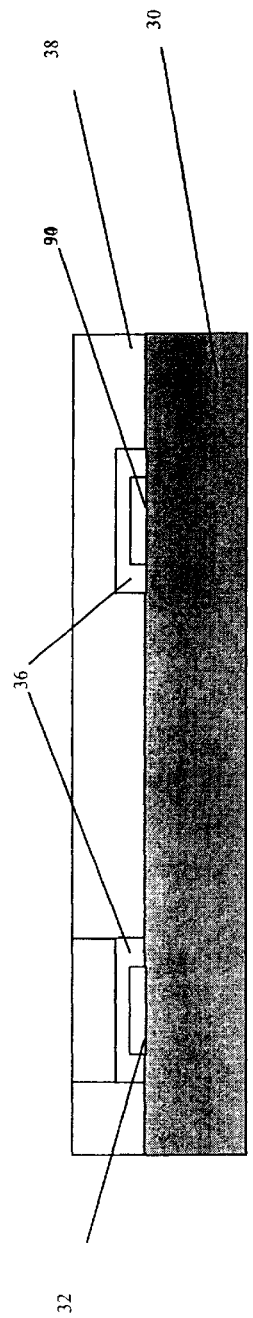

As shown in FIG. 2e, the under bump metallurgy 36 over the first bond pad 32 is etched away by immersing the die 30 in an appropriate solution such as Hydrofluoric acid, which does not dissolve aluminum, and then removing the solution with the dissolved under bump metallurgy. However, Hydrofluoric acid can be very harmful, and appropriate precautions should be taken.

Figure 2F:
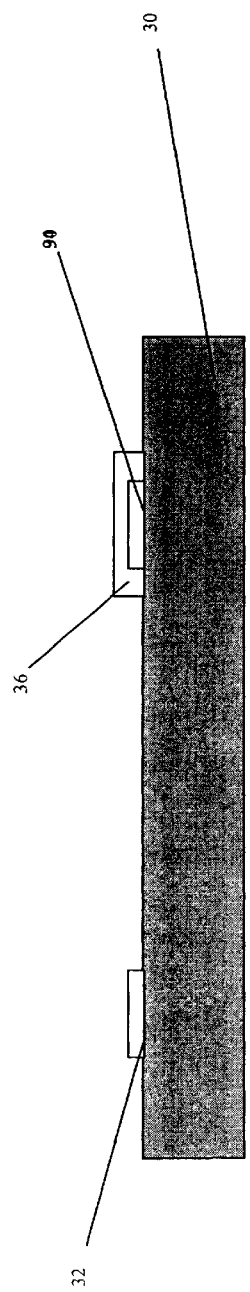

As shown in FIG. 2f, the photoresist 38 is removed. The under bump metallurgy 36 is the top most layer over the second bond pad 34 while aluminum is the top most layer over the first bond pad 32. A package such as that shown in FIG. 1 may now be readily assembled with the die 30 used as the die 12.

FIGS. 4a and 4b, respectively, show possible steps for flip chip mounting a top die 60 on a bottom die 62 that has been processed in accordance with FIGS. 2a–2f. As shown in FIG. 4a, the bottom die 62 has a first plurality of bond pads 64 and a second plurality of bond pads 66. The first plurality of bond pads 64 include aluminum such as the bond pad 32 shown in FIG. 2f while the second plurality of bond pads 66 has under bump metallurgy disposed thereon such as the bond pad 34 shown in FIG. 2f.

As shown in FIG. 4a, the top die 60, which has a plurality of solder bumps 68 on each of a third plurality of bond pads 72, is placed on the first die 30 such that each of the solder bumps 68 is bonded with a corresponding one of the second plurality of bond pads 66. Typically, the process of bonding the solder bumps 68 to the second plurality of bond pads 66 involves disposing flux on the solder bumps 68, placing the top die 60 on the bottom die 64 such that each of the solder bumps 68 contacts a corresponding one of the second plurality of bond pads 66, and then heating the resulting assembly. The solder bonding process is well known and will not be further discussed; any suitable solder bonding process may be employed. For example, an alternative method involves placing solder bumps directly on each of the second plurality of bond pads 66 and then disposing the top die 60 on the bumped bottom die 62.

After the top die 60 has been flip-chip mounted to the bottom die 62, each of a plurality of wires 70 is wire bonded to a corresponding one of the first plurality of bond pads 64, resulting in a package such as that shown in FIG. 1.

Although the foregoing invention has been described in detail to facilitate an understanding thereof, it will be apparent that certain changes and modifications may be practiced within the scope of the appended claims.

What is claimed is:

1. A method for rendering a first semiconductor die compatible with both wire bonding and solder bonding, the first semiconductor die comprising a top surface with a first bond pad and a second bond pad thereon, wherein the first and second bond pads each comprise a wire bond compatible material, the method comprising the steps of:

disposing a solder compatible material over the first bond pad and the second bond pad, wherein the wire bond compatible material remains intact on the first and second bond pads; and removing substantially all of the solder compatible material over the first bond pad such that the wire bond compatible material on the first bond pad is exposed and substantially all of the solder compatible material remains over the second bond pad.

2. The method of claim 1 wherein the solder is eutectic solder.

3. The method of claim 1 wherein the wire bond compatible material comprises aluminum.

4. The method of claim 1 wherein the solder compatible material comprises copper.

5. The method of claim 1 further comprising the step of disposing a third material over the first bond pad and the second bond pad before the step of disposing the solder compatible material over the first bond pad and the second bond pad.

6. The method of claim 5 further comprising the step of disposing a fourth material on the first bond pad and the second bond pad before the step of disposing the solder compatible material over the first bond pad and the second bond pad.

7. The method of claim 6 wherein: the solder compatible material consists of copper, the third material consists of vandium and the fourth material consists of nickel.

8. The method of claim 1 wherein the step of removing the solder compatible material comprises the step of dissolving the solder compatible material in a solution.

9. The method of claim 8 wherein the step of dissolving the solder compatible material in a solution comprises the steps of:

disposing photoresist over the solder compatible material that is over the first bond pad and the second bond pad;

removing the photoresist from the solder compatible material that is over the first bond pad, thereby exposing the solder compatible material that is over the first bond pad; and after the step of removing the photoresist, exposing the solder compatible material that is over the first bond to the solution.

10. The method of claim 1 wherein:

the step of disposing a solder compatible material over the first bond comprises the step of disposing the solder compatible material over a first plurality of bond pads and a second plurality of bond pads; and the step of removing substantially all of the solder compatible material over the first bond pad comprises the step of removing substantially all of the solder compatible material over the first plurality of bond pads such that substantially all of the solder compatible material remains over the second plurality of bond pads.

11. A method for manufacturing a semiconductor package comprising a first semiconductor die and a second semiconductor die, the first semiconductor die comprising a top surface with a first bond pad and a second bond pad thereon, wherein the first and second bond pads each comprise a wire bond compatible material, the second semiconductor die having a third bond pad on its active surface, the method comprising the steps of:

disposing a solder compatible material over the first bond pad and the second bond pad, wherein the wire bond compatible material remains intact on the first and second bond pads;

removing substantially all of the solder compatible material over the first bond pad such that the wire bond compatible material on the first bond pad is exposed and substantially all of the solder compatible material remains over the second bond pad;

mounting the second semiconductor die on the first die such that the third bond pad on the second semiconductor die is bonded to the second bond pad by solder; and wire bonding a wire to the first bond pad.

12. The method of claim 11 wherein the solder is eutectic solder.

13. The method of claim 11 wherein the wire bond compatible material comprises aluminum.

14. The method of claim 11 wherein the solder compatible material comprises copper.

15. The method of claim 11 further comprising the step of disposing a third material over the first bond pad and the second bond pad before the step of disposing the solder compatible material over the first bond pad and the second bond pad.

16. The method of claim 15 further comprising the step of disposing a fourth material on the first bond pad and the second bond pad before the step of disposing the solder compatible material over the first bond pad and the second bond pad.

17. The method of claim 16 wherein the solder compatible material consists of copper, the third material consists of vanadium and the fourth material consists of nickel.

18. The method of claim 11 wherein the step of removing the solder compatible material comprises the step of dissolving the solder compatible material in a solution.

19. The method of claim 18 wherein the step of dissolving the solder compatible material in a solution comprises the steps of:

disposing photoresist over the solder compatible material that is over the first bond pad and the second bond pad;

removing the photoresist from the solder compatible material that is over the first bond pad, thereby exposing the solder compatible material that is over the first bond pad; and after the step of removing the photoresist, exposing the solder compatible material that is over the first bond to the solution.

20. The method of claim 11 wherein:

the step of disposing a solder compatible material over the first bond comprises the step of disposing the solder compatible material over a first plurality of bond pads and a second plurality of bond pads; and the step of removing substantially all of the solder compatible material over the first bond pad comprises the step of removing substantially all of the solder compatible material over the first plurality of bond pads such that substantially all of the solder compatible material remains over the second plurality of bond pads.

21. A method for rendering a first semiconductor die compatible with both wire bonding and solder bonding, the first semiconductor die comprising a top surface with a first bond pad and a second bond pad thereon, wherein the first and second bond pads each comprise a wire bond compatible material, the method comprising the steps of:

disposing a solder compatible material over the first bond pad and the second bond pad;

removing substantially all of the solder compatible material over the first bond pad such that substantially all of the solder compatible material remains over the second bond pad; and disposing a third material over the first bond pad and the second bond pad before the step of disposing the solder compatible material over the first bond pad and the second bond pad.

* * * * *